(12) United States Patent
Yi

(10) Patent No.: US 6,298,462 B1
(45) Date of Patent: *Oct. 2, 2001

(54) DATA TRANSMISSION METHOD FOR DUAL DIVERSITY SYSTEMS

(75) Inventor: Chae-Hag Yi, Kyunggi-do (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/099,488

(22) Filed: Jun. 18, 1998

(30) Foreign Application Priority Data

Jun. 25, 1997 (KR) .................................................. 97-27268

(51) Int. Cl.[7] .......................... H03M 13/00; G06F 11/00; H04B 7/216
(52) U.S. Cl. .......................... 714/784; 714/701; 370/335
(58) Field of Search ..................................... 714/752, 755, 714/756, 758, 772, 784, 701, 712, 821, 786; 370/335, 328, 329, 342

(56) References Cited

U.S. PATENT DOCUMENTS

| | | | | |
|---|---|---|---|---|
| 5,465,267 | * | 11/1995 | Todoroki | 375/279 |
| 5,719,875 | * | 2/1998 | Wei | 714/701 |
| 5,754,563 | * | 5/1998 | White | 714/757 |
| 5,799,010 | * | 8/1998 | Lomp et al. | 370/335 |
| 5,841,794 | * | 11/1998 | Inoue et al. | 714/755 |

* cited by examiner

Primary Examiner—Christine T. Tu
(74) Attorney, Agent, or Firm—F. Chau & Associates, LLP

(57) ABSTRACT

Methods for effectively transmitting data in dual diversity systems by utilizing Reed-Solomon coding is provided. Two Reed-Solomon (RS) coding schemes are considered for dual diversity systems: RS(n,k) codes with symbol diversity order of 2 and RS (n,k/2) codes with symbol diversity order of 1. We show that the second scheme utilizes the inherent error detecting capability of low rate RS codes. The RS (n, k/2) codes with symbol diversity order 1 significantly reduce the probability of undetected word error among accepted codeword and give comparable throughput to that of RS (n,k) codes with symbol diversity order 2.

15 Claims, 3 Drawing Sheets

DATA TRANSMISSION METHOD FOR DUAL DIVERSITY SYSTEMS

FIELD OF THE INVENTION

The present invention relates to data transmission systems and methods for diversity systems used to combat multipath fading in mobile radio communications and, more particularly, to data transmission methods for dual diversity systems with M-ary orthogonal signaling in "Rayleigh" fading channels.

BACKGROUND OF THE INVENTION

Diversity systems are used for fading compensation (See, D. G. Brennan, "Linear diversity combining techniques", Proc. of IRE, Vol. 47, pp. 1075–1102, June 1959.). In a dual diversity system, one symbol is transmitted over two channels and respective signals are combined at a receiver. There are several types of diversity combining techniques in practical use: selection combining (SC), equal gain combining (EGC), and maximal ratio combining (MRC). In the SC technique, a channel with the largest signal to noise ratio is selected. SC is simply implemented with orthogonal signaling and noncoherent demodulation which are frequently used in fading channels (G. Chyi, J. G. Proakis, and C. M. Keller, "On the symbol error probability of maximum selection diversity reception schemes over a Rayleigh fading channel", IEEE Trans. Commun. Vol. 37, No. 1, pp. 78–83, January 1989.). The most efficient communication system design for M-ary orthogonal channels with noncoherent demodulation would employ low rate codes over a Galois field GF(q) with M=q (W. E. Ryan and S. G. Wilson, "Two classes convolutional codes over GF(q) for q-ary orthogonal signaling", IEEE Trans. Commun. Vol. 39, No. 1, pp 30–40, January 1991.).

There are two kinds of coding techniques for dual diversity systems: one has each code symbol transmitted twice over each channel and the other has transmitted symbols that are made to differ from channel to channel through a special channel coding operation (G. Benelli, "Two coding techniques for diversity communications systems", IEEE Trans. Commun. Vol. 38, No. 9, pp. 1530–1538, September 1990.). In the second technique, it is generally required to use multi-level coding operations.

When a codeword $\bar{c}$ is transmitted over a communication channel, channel noise may corrupt the transmitted signals. As a result, a receiver receives the corrupted version of the transmitted codeword $\bar{c}+\bar{e}$, where $\bar{e}$ is an error pattern of some weight u. The result of bounded distance decoding is categorized into three types: correct decoding, decoding failure, and decoding error. If $u \leq t$, then a bounded distance decoder on the receiver'send detects and corrects the error $\bar{e}$ and recovers $\bar{c}$. If $u>t$, then the decoder fails and either detects the presence of the error pattern but is unable to correct it, or miscorrects the received pattern $\bar{c}+\bar{e}$ for some other codeword $\bar{c}^l$ if the received pattern falls into the radius l Hamming sphere of $\bar{c}^l$. Miscorrection is more serious than error detection. This can occur when an error pattern $\bar{e}$ is of weight u>t+1. Assuming that all error patterns of weight u are equally probable, decoding failure occurs when a received word is not contained in a decoding sphere of any codeword. Decoding failure is a kind of error detection. The conditional probability of decoding failure and undetected error are related with the geometry of code in a vector space $GF(q)^n$. Let $P_E(u)$ denote the decoder error probability given that an error pattern of weight u occurs. $P_E(u)$ is given by the ratio of the number of decodable words of weight u to the number of words of weight u in the whole vector space. Let Q be the probability that a completely random error pattern will cause a decoder error. Then Q is the ratio of the number of decodable words to the cardinality of the whole vector. It is given by $$Q = \frac{(q^k-1)\sum_{i=0}^{t}\binom{n}{i}(q-1)^i}{q^n} \quad (1)$$

It is known that $P_E(u)$ is less than or approximately equal to Q which is independent of u for Reed-Solomom codes (K. M. Cheung, "More on the decoder error probability for Reed-Solomon codes", IEEE Trans. Inform Theory, Vol. 35, No. 4, pp. 895–900, July 1989.).

SUMMARY OF THE INVENTION

It is therefore an object of the present invention to provide systems and methods for effectively transmitting data in dual diversity systems with M-ary orthogonal signaling in Rayleigh fading channels by utilizing Reed-Solomon coding.

To attain the above object, according to an aspect of the present invention, there is provided a method for transmitting data in dual diversity systems, comprising the steps of coding k information symbols into n symbols, and transmitting each of the coded symbols over each of channels simultaneously.

In this method, for k information symbols, one codeword with a rate of k/n is needed, and each symbol is transmitted twice over two independent channels, that is, it has a channel diversity order of 2.

According to another aspect of the present invention, there is provided a method for transmitting data in dual diversity systems, comprising the steps of dividing k information symbols into two groups each having k/2 symbols, coding each k/2 symbols into n symbols, and transmitting the two groups of symbols over two channels, respectively.

In this method, for k information symbols, two codewords with a rate of k/2n are needed, and each symbol is transmitted once over one of two channels, that is, it has a channel diversity order of 1.

The above methods use the same number of channels during the same interval for k information symbols. These coding methods improve the error probability performance. The design rule of these data transmission methods are determined by using the after-decoding property of Reed-Solomon code.

A dual diversity system for transmitting data in accordance with the present invention includes coding means for coding k information symbols into n symbols, and transmitting means for transmitting the coded symbols over channels simultaneously. The coding means preferably includes a Reed-Solomon encoder for coding the information symbols into Reed-Solomon codes. The channels are preferably two independent channels and the transmitting means transmits the coded symbols twice over the two independent channels.

Another dual diversity system for transmitting data in accordance with the present invention includes dividing means for separating k information symbols into two groups each having k/2 symbols, coding means for coding each group of k/2 symbols into n symbols, and transmitting means for sending the two groups of symbols over two independent channels, respectively. The coding means preferably includes a Reed-Solomon encoder and the information symbols are preferably coded into Reed-Solomon codes. The transmitting means preferably transmits the coded symbols once over one of the two channels. The dividing means may includes a codeword divider.

The present invention will be better understood from the following detailed description of the exemplary embodiments thereof taken in conjunction with the accompanying drawings, and its scope will be pointed out in the appended claims.

DETAILED DESCRIPTION OF PREFERRED EMBODIMENTS

Preferred embodiments of the present invention will now be described with reference to the accompanying drawings.

Considered is a dual diversity system in Rayleigh fading channels where fading is so slow that the signal to noise ratio (SNR) is constant at least during a symbol interval. Assume that signals in each channel undergo independent fading and that each channel has identical average SNR. The average SNR in each channel is given by $$\Gamma_c = \frac{1}{L} \frac{E_b}{N_0} \log_2 M \quad (2)$$

where L is symbol diversity order, $E_b/N_0$ is average SNR per information bit, and M is the size of an orthogonal signal.

Figure 1:
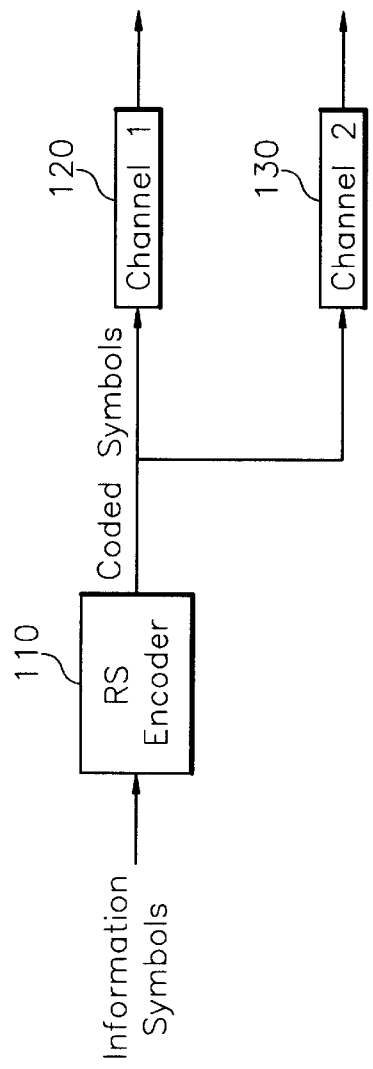
FIG. 1 is a schematic block diagram of a data transmitter for dual diversity systems according to an embodiment of the present invention.

Referring to FIG. 1, a data transmitter for dual diversity systems according to an embodiment of the present invention is illustrated in a block diagram. For data transmission, Reed-Solomon (RS) coding is preferably used. In this transmitter, k information symbols are coded into n symbols by use of RS (n,k) code, i.e by RS encoder 110. Respective coded symbols are transmitted over two independent channels 120 and 130 simultaneously. For k information symbols, one codeword with rate k/n is needed, and each coded symbol is transmitted twice over the two channels 120 and 130, that is, it has channel diversity order of 2.

Figure 2:
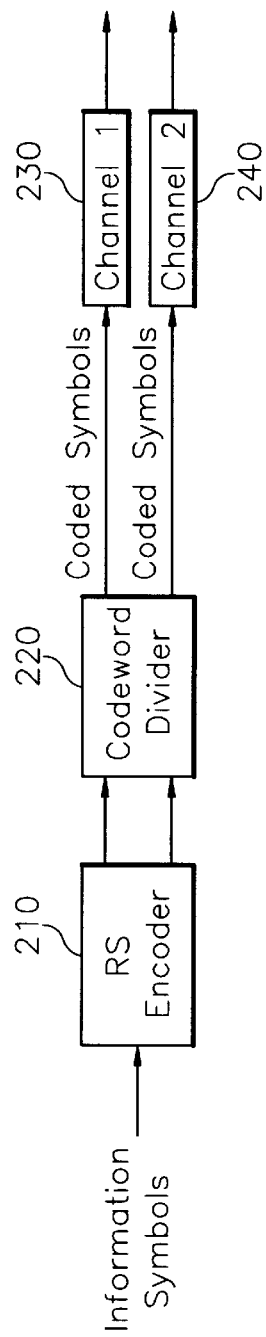
FIG. 2 is a schematic block diagram of a data transmitter for dual diversity systems according to another embodiment of the present invention.

FIG. 2 is a block diagram illustrating a data transmitter for dual diversity systems according to another embodiment of the present invention. This transmitter also uses RS coding for data transmission. In this transmitter, k information symbols are divided into two groups each having k/2 symbols. Each k/2 symbols are coded into n symbols by use of RS (n,k/2) code, i.e., by RS encoder 210. Each codeword is divided into two groups each having length n/2 by a codeword divider 220. Each of coded groups is transmitted over a corresponding channel 230 or 240. In this scheme, two codewords each having rate k/2n are needed for k information symbols, and each symbol is transmitted once over the corresponding channel, that is, it has channel diversity order of 1.

Both above-described schemes use the same number of channels during the same interval for k information symbols.

The after-decoding property of RS codes with same code length is considered. Let $P_E(u)$ denote the decoder error probability given that an error pattern of weight u occurs. For RS (n,k) code over GF(q), the minimum distance is n−k+1. Therefore, the error correcting capability t is given by t=(d−1)/2=(n−k)/2. $P_E(u)$ is given by $$P_E(u) = \frac{\sum_{i=0}^{t} \binom{n}{i}(q-1)^i}{q^{n-k}} = \frac{\sum_{i=0}^{\frac{n}{2}(1-r)} \binom{n}{i}(q-1)^i}{q^{n(1-r)}} \quad (3)$$

where r=k/n is the code rate.

Figure 3:
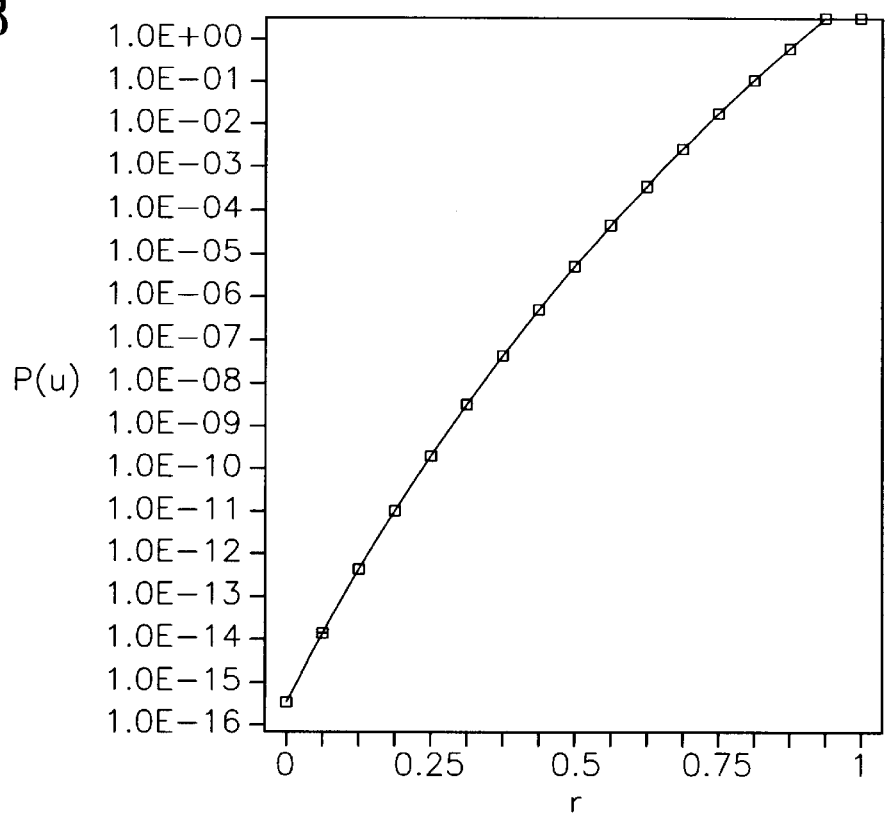
FIG. 3 is a graph illustrating decoder error probability of Reed-Solomon code with code length 32 over Galois field GF(32) given that an error pattern of weight u occurs as a function of code rate.

The decoder error probability $P_E(u)$ is shown in FIG. 3 as a function of code rate with code length 32 over GF(32). As code rate decreases, $P_E(u)$ decreases. This means that the decoding failure happens more often than the decoding error as code rate decreases. From this, it can be inferred that low rate RS(n,k/2) code has inherently more error detection capability than that of high rate RS(n,k) code since decoding failure is a kind of error detection.

The decoding performance of two data transmission methods for dual diversity systems in Rayleigh fading channels in accordance with the present invention is analyzed. For M-ary orthogonal signaling with noncoherent demodulation and selection combining with diversity order L, the average symbol error probability is given in the article by Chyi et al., "On the symbol error probability of maximum selection diversity reception schemes over a Rayleigh fading channel" (IEEE Trans. Commun. Vol. 37, No.1, pp. 78–83, January 1989), and is given by $$P_e = \sum_{m=1}^{M-1} \frac{(-1)^{m+1}}{m+1} \binom{M-1}{m} \prod_{l=1}^{L} \frac{l}{l + \frac{m}{m+1}\Gamma_c} \quad (4)$$

The error probabilities are independent of which codeword is transmitted. Assume that all zero codewords are transmitted. Let P(j) be the probability that a received word is decoded as a codeword with weight j. With bounded distance decoding, P(j) is given in an article by S.B Wicker, "Reed-Solomon error control coding for Rayleigh fading channels with feedback" (IEEE Trans. Vehic. Tech. Vol. 41, No. 2, pp. 124–133, May 1992.), and is given by $$P(j) = \sum_{v=0}^{t} \sum_{w=0}^{t-v} \left[ \binom{n-j}{v} P_e^v (1-P_e)^{n-j-v} \right] \left[ \binom{j}{w} \left(1 - \frac{P_e}{q-1}\right)^w \left(\frac{P_e}{q-1}\right)^{j-w} \right] \quad (5)$$

The probability of undetected word error is given by $$P_{uw} = \sum_{j=d}^{n} A_j P(j) \quad (6)$$

where $A_j$ is weight distribution of RS code which is given in "Error Control Coding: Fundamentals and Applications" by S. Lin and D. J. Costello, Jr. (Prentice-Hall, 1983.).

The probability of correct decoding is given by P(O) in equation (5). The probability that a received vector is accepted is given by $$P_A = P(O) + P_{uw} \quad (7)$$

Therefore, the probability of undetected word error among accepted codewords is give by $$P_w = \frac{P_{uw}}{P_A} \quad (8)$$

The normalized throughput is given by $$\eta = \frac{1}{L}\frac{k}{n}P_A \quad (9)$$

where k/n is code rate and L is symbol diversity order.

The performance of two coding schemes for diversity systems is evaluated for Reed-Solomon codes (32,k) with 32-ary orthogonal modulation in Rayleigh fading channel. Ideal interleaving is assumed. The probability of undetected word error among accepted codewords $P_u$ and normalized throughput η are computed from equations (8) and (9).

Figure 4:
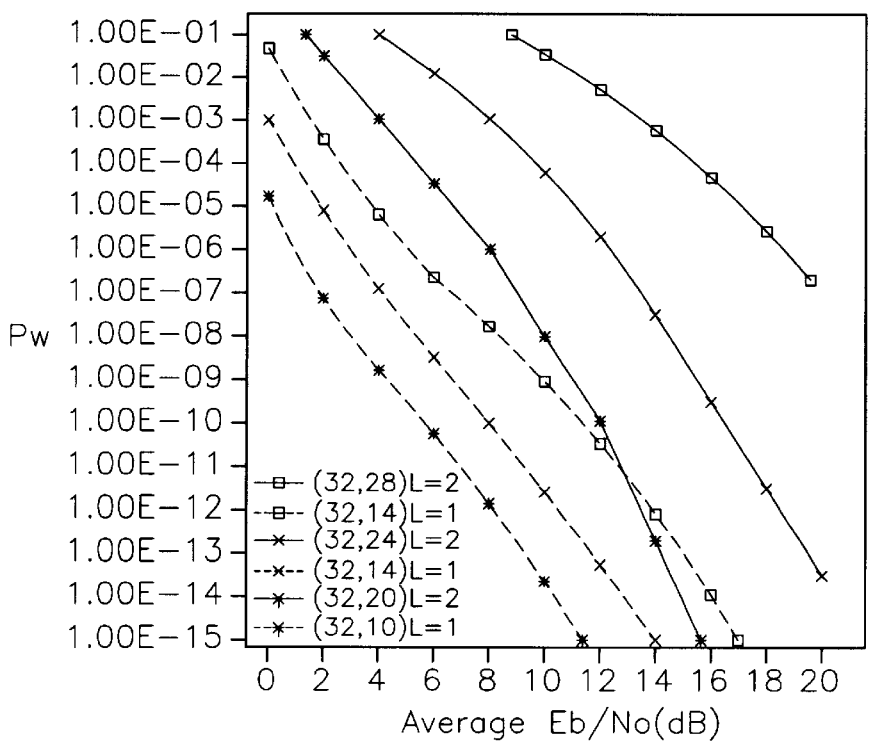
FIG. 4 is a graph illustrating undetected word error among accepted codewords of RS(32,k) codes and RS(32,k/2)

In FIG. 4, the probability of undetected word error among accepted codewords $P_w$ is shown for RS (32,k) code with symbol diversity order 2 and RS (32,k/2) code with symbol diversity order 1, where k=28, 24, 20. It can be seen that $P_w$ is much smaller with RS (32,k/2) code with symbol diversity order 1. When average $E_b/N_0$ is low, $P_w$ has unusual shape since there are few accepted code words.

Figure 5:
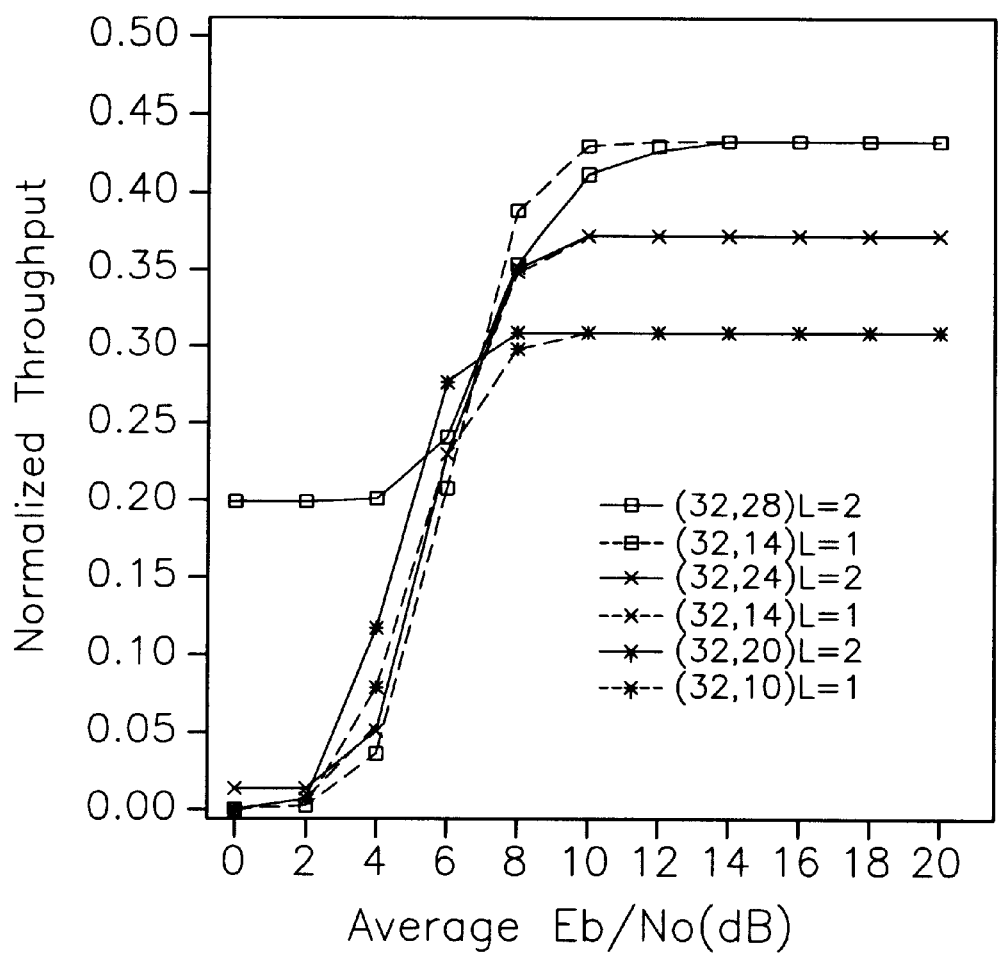
FIG. 5 is a graph illustrating normalized throughput of RS(32,k) codes and RS(32,k/2).

FIG. 5 shows normalized throughput for RS (32,k) code with symbol diversity order 2 and RS(32,k/2) code with symbol diversity order 1, where k=28, 24, 20. It is shown that the normalized throughput is almost equal for the average $E_b/N_0$=10 dB and above.

It is appreciated that the RS (n,k/2) codes with symbol diversity order of 1 significantly reduce the probability of undetected word error among accepted codewords and give comparable throughput to that of RS (nk) codes with symbol diversity order of 2.

While the invention has been described in its exemplary embodiments, it is to be understood that the design rule of the coding methods according to the present invention are determined by using the after-decoding property of Reed-Solomon code. The words which have been used are words of description rather than limitation and that changes within the purview of the appended claims may be made without departing from the true scope of the invention as defined by the claims.

What is claimed is:

1. A method for transmitting data in a diversity system for compensating multipath fading in mobile radio communications, comprising the steps of:

providing k information symbols of a signal to be transmitted for the mobile radio communications;

coding the k information symbols into n coded symbols to obtain a codeword having a code rate of k/n; and transmitting the codeword over at least two independent channels for the diversity system, wherein the at least two independent channels transmit the codeword simultaneously.

2. The method of claim 1, wherein the coding step includes performing Reed-Solomon coding with respect to the k information symbols which are coded into RS(n, k) codes.

3. The method of claim 1, wherein the transmitting step includes transmitting the codeword twice over the at least two independent channels.

4. The method of claim 1, wherein the at least two independent channels include first and second channels over which the codeword is transmitted simultaneously, the first and second channels having first and second signal to noise ratios, respectively.

5. A method for transmitting data in a dual diversity system for compensating multipath fading in mobile radio communications, comprising the steps of:

providing k information symbols of a signal to be transmitted for the mobile radio communications;

dividing the k information symbols into two symbol groups each having k/2 information symbols;

coding the k/2 information symbols of each of the two symbol groups into n coded symbols to obtain a codeword having a code rate of k/2n;

dividing the codeword into two code groups each having a code length of n/2; and transmitting the two code groups over two independent channels for the dual diversity system, each of the two code groups being simultaneously transmitted over corresponding one of the two independent channels.

6. The method of claim 5, wherein the coding step includes performing Reed-Solomon coding with respect to the k/2 information symbols which are coded into RS(n, k/2) codes.

7. The method of claim 5, wherein the two independent channels have channel diversity order of one (1) so that the two code groups are transmitted once over the respective two independent channels.

8. The method of claim 5, wherein the two independent channels each have its own signal to noise ratio.

9. A dual diversity system for transmitting data for mobile radio communications, comprising:

an encoder for receiving a signal to be transmitted and for coding k information symbols of the signal into n coded symbols to generate a codeword having a code rate of k/n; and a transmitter having first and second independent channels connected to an output of the encoder in parallel, the transmitter for transmitting the codeword over the first and second independent channels simultaneously so that multipath fading in transmitted data is compensated.

10. The system of claim 9, wherein the encoder is a Reed-Solomon encoder for coding the k information symbols into Reed-Solomon codes.

11. The system of claim 9, wherein the transmitter has channel diversity order of two (2) so that the codeword is transmitted twice over each of the first and second independent channels.

12. A dual diversity system for transmitting data for mobile radio communications, comprising:

a first divider for receiving a signal to be transmitted and for dividing k information symbols of the signal into first and second symbol groups each having k/2 information symbols;

an encoder for coding the k/2 information symbols of each of the first and second symbol groups into n coded symbols to obtain a codeword having a code rate of k/2n;

a second divider for dividing the codeword into first and second code groups each having a code length of n/2; and a transmitter having first and second independent channels connected to first and second outputs of the second divider, respectively, the transmitter transmitting the first and second code groups over the first and second independent channels, respectively, so that multipath fading in transmitted data is compensated.

13. The system of claim 12, wherein the encoder is a Reed-Solomon encoder for encoding the information symbols into Reed-Solomon codes.

14. The system of claim 12, wherein the transmitter has channel diversity order of one (1) so that the first and second code groups are transmitted once over the first and second independent channels.

15. The system of claim 14, wherein the transmitter transmits the first and second code groups over the first and second independent channels simultaneously.

* * * * *